United States Patent [19]

Stein

[11] 3,972,770

[45] Aug. 3, 1976

[54] METHOD OF PREPARATION OF ELECTRON EMISSIVE MATERIALS

[75] Inventor: William W. Stein, Beaverton, Oreg.

[73] Assignee: International Telephone and Telegraph Corporation, Nutley, N.J.

[22] Filed: Mar. 21, 1975

[21] Appl. No.: 560,916

Related U.S. Application Data

[63] Continuation of Ser. No. 381,962, July 23, 1973, abandoned.

[52] U.S. Cl. .................................. 156/600; 156/3; 156/8; 156/17; 357/30; 357/31
[51] Int. Cl.² .................................. H01L 21/20
[58] Field of Search ............ 156/3, 8, 17, 600, 605; 29/578, 579; 357/30, 31; 313/94

[56] References Cited
UNITED STATES PATENTS

| | | | |
|---|---|---|---|
| 3,752,713 | 8/1973 | Sakuta et al. | 156/605 |
| 3,764,424 | 10/1973 | Sayko | 156/17 |
| 3,801,391 | 4/1974 | Dyment et al. | 156/17 |
| 3,868,523 | 2/1975 | Klopfer et al. | 357/30 |
| 3,913,215 | 10/1975 | Heckl | 156/17 |

FOREIGN PATENTS OR APPLICATIONS

| | | | |
|---|---|---|---|
| 2,261,757 | 12/1972 | Germany | 357/30 |

OTHER PUBLICATIONS

Kressel, H., "Method of Making a Transmission Photocathode Device," U.S. Published Patent Appl. B 309756.

Primary Examiner—William A. Powell
Assistant Examiner—Jerome W. Massie
Attorney, Agent, or Firm—John T. O'Halloran; Thomas M. Marshall

[57] ABSTRACT

Preferential etches for Gallium Arsenide and Gallium Aluminum Arsenide materials provide a novel single crystalline layer thin film of GaAs for use as a free standing transmission secondary electron emitter or as a photocathode layer on an intermediate epitaxial layer of GaAlAs. Etching of a central area of a substrate layer of GaAs provides an annular rim supporting structure for the epitaxial GaAlAs and GaAs layers. A particular composition of hydrogen peroxide and ammonium hydroxide preferentially etches GaAs while hydrochloric acid preferentially etches GaAlAs.

8 Claims, 3 Drawing Figures

METHOD OF PREPARATION OF ELECTRON EMISSIVE MATERIALS

This is a continuation of application Ser. No. 381,962 filed July 23, 1973. now abandoned.

BACKGROUND OF THE INVENTION

1. Field of the Invention

The present invention relates to semiconductor electron emissive materials for use in electron tubes and particularly to novel structures and processes providing a free standing thin film of GaAs as a transmission secondary electron emitter or as a photocathode layer supported on a layer of GaAlAs.

2. Description of the Prior Art

The use of GaAs as a thin film self-standing transmission electron emissive material has been known and techniques for obtaining such films include electrolytic, chemical and vapor etching processes and mechanical polishing methods which require precise control with constant careful attention during processing. The thin films may have imperfections and non-uniformities and are difficult to assemble and utilize in a vacuum tube environment. Preferential etches have been used with a GaAs/GaP structure wherein nitric acid etches GaAs but does not dissolve GaP. This process is described further in U.S. Pat. No. 3,429,756, issued Feb. 25, 1969. Nitric acid however would also etch GaAlAs. It is likewise known that hydrochloric acid preferentially etches GaAlAs while not affecting GaAs. The use of a thin monocrystalline semiconductor layer supported on a thicker transparent layer as a target window in an image tube is also shown in U.S. Pat. No. 3,579,012, issued May 18, 1971. These prior art devices however required complex processes and structures and were not useful with the combination of GaAs and GaAlAs materials which have desirable characteristics for radiation sensitive electron emissive structures such as used in electron tubes for photocathodes and electron multipliers.

SUMMARY OF THE INVENTION

It is therefore the primary object of this invention to provide novel simplified processes and structures for use with GaAs - GaAlAs materials as improved radiation sensitive electron emissive devices.

These results are achieved with a novel preferential etching composition and process using a substrate layer of GaAs having an intermediate epitaxially grown layer of GaAlAs and an outer epitaxial electron emissive layer of GaAs. A specific composition of hydrogen peroxide and ammonium hydroxide preferentially etches the GaAs layer to form a supporting rim for the GaAlAs and GaAs epitaxial layers to provide a photocathode structure. A further preferential etch with hydrochloric acid of the intermediate GaAlAs layer provides a free standing thin film of GaAs supported on a double layered rim to provide a transmission secondary emissive electron multiplier layer. Another variation includes a four-layered structure of a substrate of GaAs, a first epitaxial GaAlAs layer, and intermediate GaAs epitaxial layer and an outer GaAlAs epitaxial layer. Preferential etching provides a double layered rim of the GaAs substrate and first GaAlAs layer supporting the second GaAs and GaAlAs outer epitaxial layers to form a photocathode which emits electrons from the intermediate GaAs layer. Other objects and advantages will become apparent from the following description in conjunction with the accompanying drawings.

DESCRIPTION OF THE PREFERRED EMBODIMENTS

Figure 1:
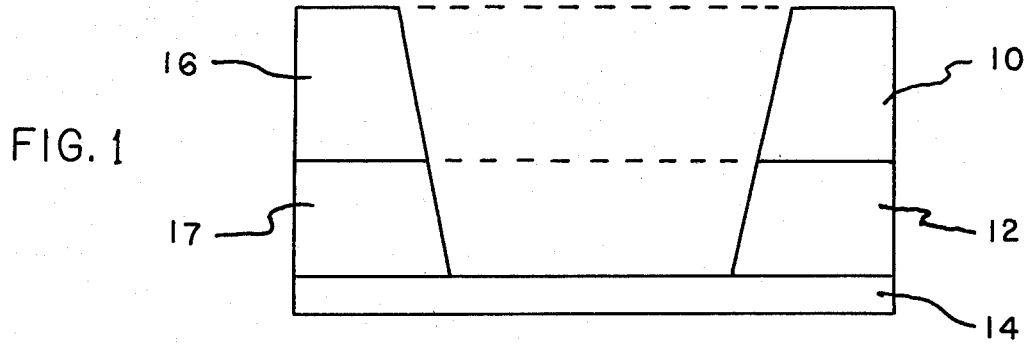
FIG. 1 shows a thin free standing layer of GaAs providing a transmission secondary electron emissive film on a rim of GaAs and GaAlAs layers made in accordance with the present invention.

As shown in FIG. 1, a first substrate layer 10 of GaAs of about 20 mils thickness is prepared in a known manner for epitaxially growing an intermediate second layer 12 of GaAlAs thereon of a thickness of from 20 to 50 microns. An outer third epitaxial layer 14 of GaAs of from 3 to 8 microns is then grown on the GaAlAs layer. The thin epitaxial layers are generally grown on the thicker GaAs substrate which may be obtained commercially. GaAlAs materials are not readily available due to formations of oxide films which present added processing difficulties. The GaAlAs material produced in this case is of a composition $Ga_xAl_{1-x}As$, where $x$ varies from 0.7 to 0 and $1-x$ from 0.3 to 1. Typical dimensions of the overall widths or diameters of the layers may be about 1-2 cm, while the rim may be a few mm in width between inner and outer diameters.

In order to form a free standing transmission secondary electron emissive multiplier layer of the outer epitaxial GaAs layer, the substrate GaAs layer and intermediate support layer of GaAlAs are etched by a twostep preferential etching method using a novel composition to form the unique rim support structure as provided by the present invention. The preferred etchant solution, which has been found to provide the desired preferential action to etch GaAs and not to etch GaAlAs, is formed of equal volumes of a 30% solution of hydrogen peroxide, $H_2O_2$, and a 28% solution of ammonium hydroxide, $NH_4OH$, with the balance being water, $H_2O$. The solution is preferably used in a temperature range of from 30° to 100°C. This first etchant completely removes the GaAs substrate from the epitaxial layer of GaAlAs. By applying a suitable coating of wax around the upper peripheral surface of the outer layer 10, the etching is limited to a central circular area which leaves a small annular tapered rim 16 as a supporting structure. The dashed lines indicate the areas of the layers which are etched away. A second etchant, preferably hydrochloric acid, is then similarly applied in the central area to preferentially etch the GaAlAs layer while not dissolving GaAs, the latter being inert to HCl while GaAlAs is soluble in HCl. The etching actions are self-controlled and automatic since only the desired layer is etched by each solution, so that constant attention is not required. Typical etching times may be 1 to 1½ hours for the substrate GaAs layer and 10 minutes for the GaAlAs layer. The particular mixture of the $H_2O_2$ - $NH_4OH$ etchant may be varied in accordance with the amount of aluminum in the GaAlAs layer to obtain the desired preferential etching action over the indicated range of materials.

A second narrow annular support rim 17 of GaAlAs is thus provided between the GaAs substrate rim 16 and the remaining free standing thin film 14 of GaAs which forms the transmission secondary electron emitter for use in an electron multiplier or amplifier within the vacuum environment of an electron tube. The double layer rim provides a support structure for mounting in an electron tube device. The GaAs film emits electrons from either or both sides upon excitation by a beam of electrons directed onto either side.

Figure 2:
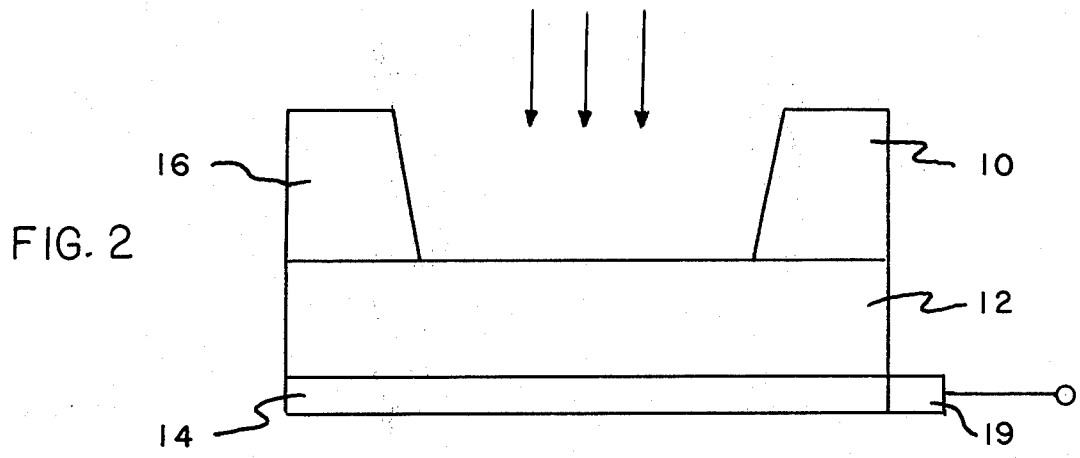
FIG. 2 shows a GaAlAs - GaAs layered structure on an etched substrate rim of GaAs to provide a photocathode.

In order to form a photocathode structure, a similar process is employed. However, an intermediate visible light transmissive GaAlAs layer is required to allow electron emission in one direction only from the outer surface of the outer epitaxial layer of GaAs and act as a mechanical support for said GaAs photocathode layer. In this process, as shown in FIG. 2, only one preferential etching step is employed to remove the center area of the first GaAs substrate layer 10, except for the supporting rim 16, while leaving the remaining intermediate GaAlAs and outer GaAs epitaxial layers 12, 14. In this case, incoming light, as indicated by the arrow, is projected from the rim end onto the intermediate GaAlAs layer. This in turn causes electron flow from the outer surface of the GaAs layer into the vacuum environment of an electron tube structure. A suitable ohmic contact 19 is applied to the thin GaAs photocathode layer in a known manner.

Figure 3:
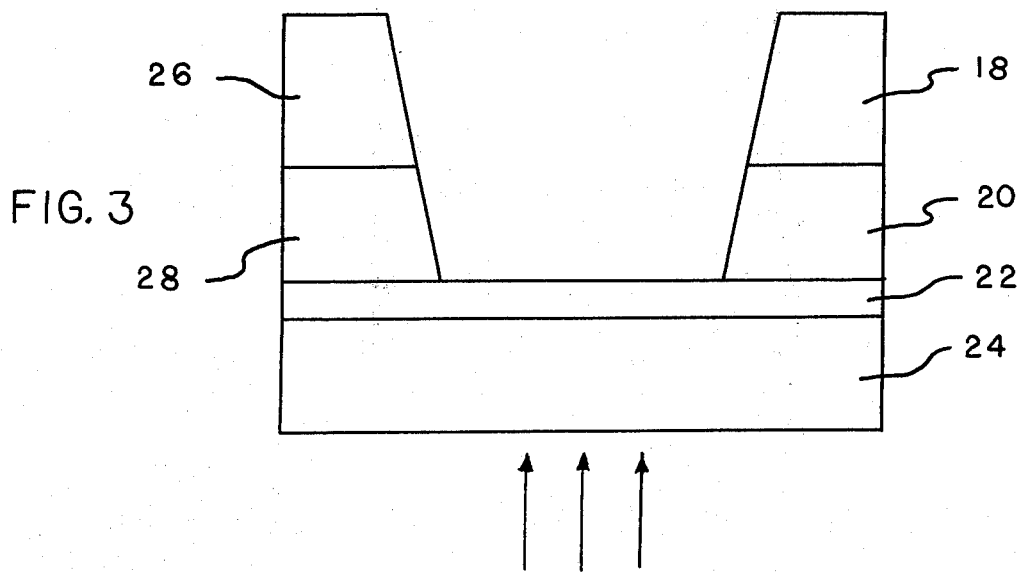
FIG. 3 shows another photocathode structure having layers of GaAs and GaAlAs on an etched rim of GaAs and GaAlAs.

Another form of a photocathode device is shown in FIG. 3. In this case a first substrate layer 18 of GaAs is prepared for growing a first GaAlAs epitaxial layer 20 thereon, a second epitaxial GaAs layer 22, and a third epitaxial GaAlAs layer 24, similar to those in FIGS. 1 and 2, with the addition of the further outer GaAlAs layer 24. Preferential etching of the GaAs substrate layer 18 is performed with the $H_2O_2$ and $NH_4OH$ solution to leave a first rim layer 26 of about 20 mils in thickness. A second etch with HCl etches the GaAlAs layer 20 to leave a second rim layer 20 of about 0.5 to 1 mil, which with rim 26 supports the other two layers of the photocathode. Layer 22 is from 3 to 8 microns thick, while layer 24 is from 1 to 2 mils in thickness. Light is directed onto the open side of the GaAlAs layer 24 which causes electron emission from the GaAs layer 22 on the rim side.

While only a limited number of embodiments have been illustrated and described, it is to be understood that many other variations may be made in the particular configuration and method without departing from the scope of the invention as set forth in the appended claims.

What is claimed is:

1. A method of making a radiation sensitive electron emissive semiconductor device comprising:

forming a first relatively thin epitaxial layer of GaAlAs onto a relatively thick substrate layer of GaAs, said first layer being thinner than said substrate, forming a second thin monocrystalline epitaxial layer of GaAs onto said first epitaxial layer, said second layer being thinner than said first and substrate layers and sufficiently thin to be capable of emitting electrons within a vacuum upon excitation by radiation, and etching away a central portion of said substrate layer with an etchant which preferentially etches GaAs but does not etch GaAlAs to expose a surface of said GaAlAs layer and to leave a peripheral supporting rim of said GaAs substrate layer.

2. The method of claim 1 wherein said etchant which preferentially etches GaAs is a solution of hydrogen peroxide and ammonium hydroxide.

3. The method of claim 2 wherein said GaAlAs is of the composition $Ga_xAl_{1-x}As$ where x is of a value from 0.7 to 0.

4. The method of claim 2 wherein said etchant is a mixture of equal volumes of a 30% solution of $H_2O_2$ and a 28% solution of $NH_4OH$, with a balance of water.

5. The method of claim 3 wherein said monocrystalline layer is from 3 to 8 microns in thickness.

6. A method of making a radiation sensitive electron emissive conductor device comprising:

forming a first relatively thin epitaxial layer of GaAlAs having the composition $Ga_xAl_{1-x}As$, where x is of a value from 0.7 to 0 onto a relatively thick substrate layer of GaAs, said first layer being thinner than said substrate;

forming a second thin monocrystalline epitaxial layer GaAs onto said first epitaxial layer;

said second layer being thinner than said first and substrate layers and sufficiently thin to be capable of emitting electrons within a vacuum upon excitation of radiation; and etching away a central portion of said substrate layer with an etchant which is a solution of hydrogen peroxide and ammonium hydroxide and etching away a central portion of the first epitaxial layer with an etchant which preferentially etches GaAlAs but which does not etch GaAs to expose a surface of said second epitaxial layer providing a free standing layer of GaAs in said central area and to leave a peripheral supporting rim of said GaAs substrate layer aligned with said substrate rim to support said free standing layer at said rim.

7. The method of claim 6 including forming a third epitaxial layer of said GaAlAs on the side of said second epitaxial layer opposite said rim.

8. The method of claim 6 wherein said etchant which preferentially etches GaAlAs is hydrochloric acid.

* * * * *